(12) United States Patent
Soda et al.

(10) Patent No.: US 11,312,631 B2
(45) Date of Patent: *Apr. 26, 2022

(54) ALIGNED FILM AND METHOD FOR PRODUCING THE SAME

(71) Applicants: Murata Manufacturing Co., Ltd., Nagaokakyo (JP); Drexel University, Philadelphia, PA (US)

(72) Inventors: Yoshito Soda, Philadelphia, PA (US); Takeshi Torita, Philadelphia, PA (US); Yury Gogotsi, Ivyland, PA (US); Babak Anasori, Norristown, PA (US); Christine B. Hatter, Pennsauken, NJ (US)

(73) Assignees: MURATA MANUFACTURING CO., LTD., Nagaokakyo (JP); DREXEL UNIVERSITY, Philadelphia, PA (US)

( * ) Notice: Subject to any disclaimer, the term of this patent is extended or adjusted under 35 U.S.C. 154(b) by 243 days.

This patent is subject to a terminal disclaimer.

(21) Appl. No.: 16/140,703

(22) Filed: Sep. 25, 2018

(65) Prior Publication Data

US 2019/0092641 A1    Mar. 28, 2019

Related U.S. Application Data

(60) Provisional application No. 62/564,589, filed on Sep. 28, 2017.

(51) Int. Cl.
*C01B 32/921* (2017.01)
*C01B 32/949* (2017.01)
(Continued)

(52) U.S. Cl.
CPC .......... *C01B 32/921* (2017.08); *B82B 3/0052* (2013.01); *C01B 21/062* (2013.01);
(Continued)

(58) Field of Classification Search
None
See application file for complete search history.

(56) References Cited

U.S. PATENT DOCUMENTS 11,202,398 B2 * 12/2021 Soda ................ H05K 9/0083
2015/0187456 A1    7/2015 Young et al.
(Continued)

FOREIGN PATENT DOCUMENTS

WO    2013067280 A1    5/2013
WO    2016049109 A2    3/2016

OTHER PUBLICATIONS

Shahzad et al. (Science, Sep. 9, 2016, v353 (6304), 1137-1140) (Year: 2016).*

(Continued)

*Primary Examiner* — Kevin M Bernatz
(74) *Attorney, Agent, or Firm* — ArentFox Schiff LLP

(57) ABSTRACT

An aligned film having first and second faces opposed to each other, the aligned film having (a) a plurality of layers aligned non-parallel to the first and second faces between the faces of the aligned film, each layer having a crystal lattice represented by: $M_{n+1}X_n$ (wherein M is at least one metal of Group 3, 4, 5, 6, or 7; X is a carbon atom, a nitrogen atom, or a combination thereof; and n is 1, 2, or 3), each X is positioned within an octahedral array of M, and at least one of two opposing surfaces of each said layer have at least one modifier or terminal T selected from a hydroxy group, a fluorine atom, an oxygen atom, and a hydrogen atom; and (b) magnetic nanoparticles carried on a layer surface and/or between two adjacent layers of the plurality of layers.

19 Claims, 6 Drawing Sheets

(51) Int. Cl.
| | |
|---|---|
| B82Y 25/00 | (2011.01) |
| B82Y 30/00 | (2011.01) |
| C01B 21/06 | (2006.01) |
| B82B 3/00 | (2006.01) |
| H05K 9/00 | (2006.01) |
| C01B 32/158 | (2017.01) |

(52) U.S. Cl.
CPC ......... C01B 32/949 (2017.08); H05K 9/0088 (2013.01); *B82Y 25/00* (2013.01); *B82Y 30/00* (2013.01); *C01B 32/158* (2017.08); *C01P 2002/20* (2013.01); *C01P 2004/03* (2013.01); *C01P 2004/64* (2013.01); *C01P 2004/86* (2013.01); *C01P 2006/42* (2013.01)

(56) References Cited

U.S. PATENT DOCUMENTS

| | | | | |
|---|---|---|---|---|
| 2017/0088429 | A1* | 3/2017 | Shin | C01B 32/921 |
| 2018/0338396 | A1* | 11/2018 | Torita | H05K 9/0088 |
| 2020/0029477 | A1* | 1/2020 | Soda | B22F 1/0022 |

OTHER PUBLICATIONS

Zhang et al. (Nanoscale, 2016, 8, 7085-7093) (Year: 2016).*
Han et al. (ACS Appl. Mater. Interfaces, 2016, 8, 21011-21019) (Year: 2016).*
Li et al. (J. Mater. Chem. C., 2017, 5, 4068-4074) (Year: 2017).*
Liu et al. (Mat. Let., 248, 2019, 214-217) (Year: 2019).*
Zhao et al. (ACS App. Mat. Interfaces, 2018, 10, 42925-42932) (Year: 2018).*
Deng et al. (App. Surface Science, 488, 2019, 921-930) (Year: 2019).*
He et al. (J. Mag. Mag. Mat., 492, 2019, 165639—p. 1-6) (Year: 2019).*
Qing et al. (Ceramics Inter., 42, 2019, 16412-16416). (Year: 2019).*
Yang et al. (Mat. Chem. Phys., 200, 2017, 179-186) (Year: 2017).*
Derwent Abstract of CN 10-8793166 A (Year: 2018).*
Derwent Abstract of CN11-0283570 A (Year: 2019).*
Derwent Abstract of CN 10-9712769 A (Year: 2019).*
Encyclopedia of Britanica citation to Light Refletance and Refraction (Year: 1900).*
Shahzad, F. et al.; Electromagnetic interference shielding with 2D transition metal carbides (MXenes); Science, Sep. 9, 2016, vol. 353 Issue 6304, pp. 1137-1140.
Ghidiu, M. et al.; "Conductive two-dimensional titanium carbide 'clay' with high volumetric capacitance"; Nature, vol. 516, Dec. 4, 2014, pp. 78-81.
Ghidiu, M. et al.; "Two-Dimensional Titanium Carbide MXene As a Cathode Material for Hybrid Magnesium/Lithium-Ion Batteries"; ACS Applied Materials & Interfaces, Feb. 2017, vol. 9, Issue 5, pp. 4296-4300.
Wang, Y. et al.; "Controlled synthesis of Fe3O4@SnO2/RGO nanocomposite for microwave absorption enhancement"; Ceramics International, Jul. 2016, vol. 42, Issue 9, pp. 10682-10689.
Kim, H. et al.; "TiO2-reduced graphene oxide nanocomposites by microwave-assisted forced hydrolysis as excellent insertion anode for Li-ion battery and capacitor"; Journal of Power Sources, Sep. 2016, vol. 327, pp. 171-177.

* cited by examiner

Fig. 7 – COMPARATIVE EXAMPLE
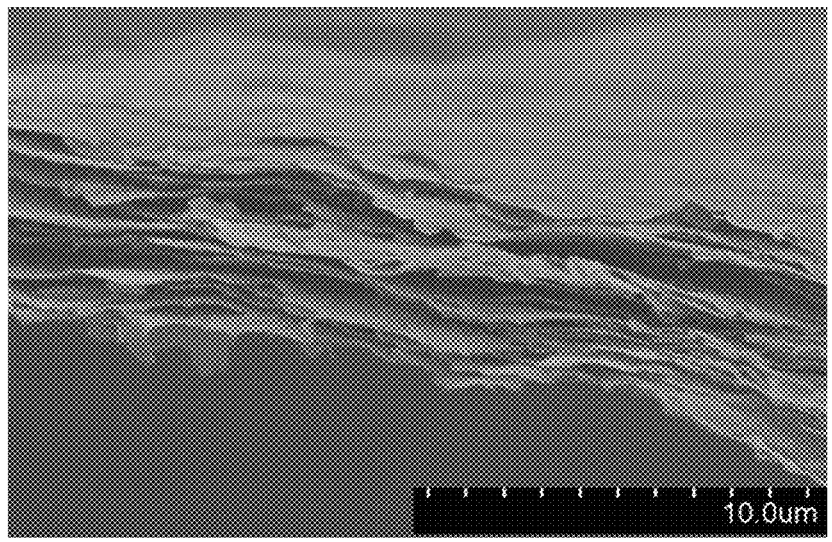
Fig. 8 – COMPARATIVE EXAMPLE
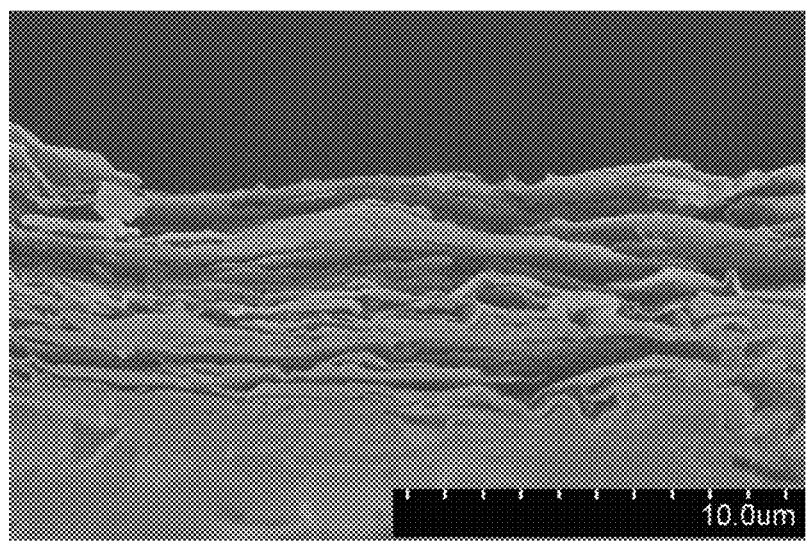

ALIGNED FILM AND METHOD FOR PRODUCING THE SAME

CROSS REFERENCE TO RELATED APPLICATIONS

The present application claims priority to Provisional Patent Application No. 62/564,589, filed Sep. 28, 2017, the entire contents of which are incorporated herein by reference.

FIELD OF THE INVENTION

The present invention relates to an aligned film, particularly an aligned film including a layered material that can also be referred to as a two-dimensional material, and a method for producing the aligned film.

BACKGROUND OF THE INVENTION

A two-dimensional material is a material mainly having a two-dimensional atomic network. In recent years, MXene has attracted attention as a new two-dimensional material (Patent Literature 1, Non Patent Literatures 1 to 3). MXene is a layered material, as will be described, comprising a plurality of layers, each layer having a lattice which is represented by $M_{n+1}X_n$ (wherein M is at least one metal of Group 3, 4, 5, 6, or 7, X is a carbon atom and/or a nitrogen atom, and n is 1, 2, or 3), and in which each X is positioned within an octahedral array of M, and having a terminal (or modifier) T such as a hydroxy group, a fluorine atom, an oxygen atom, or a hydrogen atom on the surface of each layer.

It has been reported that MXene has high electrical conductivity and high thermal conductivity, and when it is used for an electromagnetic shielding it has a high shielding effect (EMI SE) per unit thickness in the form of a film of a MXene alone or a film of a MXene-polymer composite (Non Patent Literature 1). In addition, it has been reported that MXene has a large electrostatic capacity per unit volume, and can be used as an electrode of an electrochemical capacitor, for example a pseudocapacitor, or a magnesium/lithium ion battery (Non Patent Literatures 2 and 3).
Patent Literature 1: WO 2016/049109 A2
Patent Literature 2: US 2015/0187456 A1
Patent Literature 3: WO 2013/067280 A1
Non Patent Literature 1: Faisal Shahzad, et al., "Electromagnetic interference shielding with 2D transition metal carbides (MXenes)", Science, 9 Sep. 2016, Vol. 353, Issue 6304, pp. 1137-1140
Non Patent Literature 2: Michael Ghidiu, et al., "Conductive two-dimensional titanium carbide 'clay' with high volumetric capacitance", Nature, 4 Dec. 2014, Vol. 516, pp. 78-81
Non Patent Literature 3: Michael Ghidiu, et al., "Two-Dimensional Titanium Carbide MXene As a Cathode Material for Hybrid Magnesium/Lithium-Ion Batteries", Applied Materials & Interfaces, February 2017, Vol. 9, Issue 5, pp. 4296-4300
Non Patent Literature 4: Yanping Wang, et al., "Controlled synthesis of $Fe_3O_4$@$SnO_2$/RGO nanocomposite for microwave absorption enhancement", Ceramics International, July 2016, Volume 42, Issue 9, pp. 10682-10689
Non Patent Literature 5: Hyun-Kyung Kim, et al., "$TiO_2$-reduced graphene oxide nanocomposites by microwave-assisted forced hydrolysis as excellent insertion anode for Li-ion battery and capacitor", Journal of Power Sources, September 2016, Volume 327, pp. 171-177

SUMMARY OF INVENTION

The present inventors have paid attention to the fact that when MXene is used for an electromagnetic shielding, the ratio of a reflection component to the total shielding effect is high (see, for example, FIG. 3F in Non Patent Literature 1; in the case of a film of $Ti_3C_2T_x$ alone, the reflection component occupies about 20 dB in the total shielding effect of 60 dB), and the present inventors have found that there is the problem that reflected electromagnetic waves may cause damage to electronic devices etc. (more specifically, members that form an electronic circuit) in the electromagnetic shielding. In addition, the present inventors have paid attention to the fact that when MXene is used as an electrode material of a capacitor, the capacity decreases as the thickness of MXene which forms the electrode increases (see, for example, FIG. 3e in Non Patent Literature 2), and the present inventors have found that there is the problem that MXene is not suitable for forming a relatively thick electrode. The present inventors have found for the first time that such a problem is caused by a situation in which when MXene is molded into a film shape under normal gravity by, for example, evaporation of a liquid medium, or use of a binder, the plane (two-dimensional sheet plane) of respective layers of MXene in this film are normally generally parallel to the principal plane of the film. It is considered that when the above-mentioned film containing MXene is used as an electromagnetic shielding, electromagnetic waves are incident perpendicularly to a principal plane (shield plane) of the film, hence to the surface of respective layers of MXene, and therefore electromagnetic waves are easily reflected. It is considered that when the above-mentioned film containing MXene is used as an electrode, the electrode is disposed in such a manner that a direction in which ions of an electrolyte are transported is perpendicular to a principal plane (electrode plane) of the film, hence to the surface of respective layers of MXene, and therefore the ions of the electrolyte are hardly transported between adjacent layers of MXene.

Incidentally, graphene has been heretofore known as one of two-dimensional materials (Patent Literatures 2 and 3, Non Patent Literatures 4 and 5). Graphene is a monoatomic layer substance in which carbon atoms are bonded in the form of a honeycomb. With regard to graphene, it is known that graphene has a considerably low electrical conductivity in a thickness direction, and therefore by aligning graphene perpendicularly with graphene dispersed in an insulating resin, an anisotropic electrically conductive film which is electrically conductive in a perpendicular direction and electrically insulating in a horizontal direction can be formed (Patent Literature 2). In addition, when graphite particles obtained by stacking graphene are deposited on an electrically conductive base material such as a copper foil, and pressed to form an electrode for a lithium ion battery, the sheet plane of graphene is parallel to the electrically conductive base material, a direction in which intercalation of lithium ions may occur is perpendicular to a current direction, and thus the intercalation may be retarded, leading to insufficient electrical contact between the graphite particles and the electrically conductive base material. Thus, it has been proposed to align graphene perpendicularly to the electrically conductive base material (Patent Literature 3).

However, MXene has a remarkably high carrier density (carrier concentration) and a high electrical conductivity in an in-plane direction, and also has a higher electrical conductivity than graphene in the thickness direction because MXene contains metal atoms M. Therefore, it has not been heretofore considered that in place of graphene, MXene is used for forming an anisotropic electrically conductive film.

In these circumstances, the present inventors have reached the present invention as a result of diligent studies to provide a novel film containing MXene.

According to one aspect of the present invention, there is provided an aligned film having first and second faces opposed to each other, the aligned film comprising:

(a) a layered material comprising a plurality of layers aligned non-parallel to the first and second faces between the first and second faces, each layer having a crystal lattice represented by:

$$M_{n+1}X_n$$

wherein M is at least one metal of Group 3, 4, 5, 6, or 7,
X is a carbon atom, a nitrogen atom, or a combination thereof,
n is 1, 2, or 3,
each X is positioned within an octahedral array of M, and
at least one of two opposing surfaces of said each layer has at least one modifier or terminal T selected from a hydroxy group, a fluorine atom, an oxygen atom, and a hydrogen atom; and (b) magnetic nanoparticles carried on a layer surface and/or between two adjacent layers of the plurality of layers.

In the aligned film of the present invention, magnetic nanoparticles are carried on the prescribed layered material (also referred to as "MXene" in this specification), and the nanoparticles are present on the layer surface of the plurality of layers and/or between two adjacent layers in MXene, so that the plurality of layers can be conveniently aligned only by applying a relatively weak magnetic field. As a result, a novel film containing MXene can be obtained.

In an embodiment of the present invention, the plurality of layers may be aligned perpendicularly or in an inclined manner at an angle of not more than 80 degrees with respect to a perpendicular direction between the first and second faces.

In an embodiment of the present invention, the nanoparticles may be carried on the layer surface of the plurality of layers via the modifier or terminal T.

In an embodiment of the present invention, the nanoparticles may be composed of any one or a combination of two or more selected from the group consisting of nickel, iron, cobalt and ferrite.

In an embodiment of the present invention, the aligned film may further comprise carbon nanotubes.

In place of or in addition to the above-mentioned embodiment, the aligned film may further comprise a hydrophilic organic binder in which the layered material and the nanoparticles are embedded.

In an embodiment of the present invention, the aligned film may be used as an electromagnetic shielding. In this embodiment, an electromagnetic wave may enter from the first face toward the second face, and the plurality of layers may be inclined at an angle of more than 0 degree and not more than 80 degrees with respect to a direction perpendicular to the first face. To be noted the electromagnetic shielding is also referred to as electromagnetic interference (EMI) shielding.

In another embodiment of the present invention, the aligned film may be used as an electrode of a capacitor or a battery. In this embodiment, ions of an electrolyte may be transported from the first face toward the second face, and the plurality of layers may be aligned perpendicularly to the first face, or inclined at an angle of more than 0 degree and not more than 80 degrees with respect to a direction perpendicular to the first face.

According to another aspect of the present invention, there is provided a method for producing an aligned film, which comprises:

preparing a dispersion in which at least magnetic nanoparticles are dispersed in a liquid medium (or a flowable medium);

(ii) disposing in the dispersion a layered material comprising a plurality of layers to create a mixture, each layer having a crystal lattice represented by:

$$M_{n+1}X_n$$

wherein M is at least one metal of Group 3, 4, 5, 6, or 7,
X is a carbon atom, a nitrogen atom, or a combination thereof,
n is 1, 2, or 3,
each X is positioned within an octahedral array of M, and
at least one of two opposing surfaces of each said layer has at least one modifier or terminal T selected from a hydroxy group, a fluorine atom, an oxygen atom and a hydrogen atom, and applying a magnetic field to align the plurality of layers parallel to a predetermined direction; and (iii) molding the mixture into the aligned film.

In an embodiment of the present invention, the step (i) may further include carbon nanotubes dispersed in the liquid medium.

In an embodiment of the present invention, the liquid medium may comprise a hydrophilic organic binder or a precursor thereof.

According to still another aspect of the present invention, there is provided a method for producing an aligned film, which comprises:

(iv) preparing a liquid matter comprising at least magnetic precursor ions in a liquid medium;

(v) disposing in the liquid matter a layered material comprising a plurality of layers to create a mixture, each layer having a crystal lattice represented by:

$$M_{n+1}X_n$$

wherein M is at least one metal of Group 3, 4, 5, 6, or 7,
X is a carbon atom, a nitrogen atom, or a combination thereof,
n is 1, 2, or 3,
each X is positioned within an octahedral array of M, and
at least one of two opposing surfaces of each said layer has at least one modifier or terminal T selected from a hydroxy group, a fluorine atom, an oxygen atom, and a hydrogen atom, precipitating magnetic nanoparticles by using the precursor ions, and then applying a magnetic field to align the plurality of layers parallel to a predetermined direction; and (vi) molding the mixture into the aligned film.

In an embodiment of the present invention, the step (v) may be carried out by reducing the precursor ions, and for example, the reduction of the precursor ions may be performed in the presence of a reducing agent. In this embodiment, the precursor ions may comprise at least one selected from a nickel ion, an iron ion and a cobalt ion.

In an embodiment of the present invention, the step (iv) may further include carbon nanotubes in the liquid matter.

According to the present invention, magnetic nanoparticles are carried on MXene, and the nanoparticles are present on a layer surface of a plurality of layers and/or between two adjacent layers in MXene, so that the plurality of layers can be conveniently aligned only by applying a relatively weak magnetic field. As a result, a novel film containing MXene is provided. In addition, according to the present invention, a method for producing the aligned film is also provided.

BRIEF DESCRIPTION OF DRAWINGS

FIG. 7 shows one typical SEM image obtained by SEM observation of a cross-section of a film in Comparative Example 2.

FIG. 8 shows one typical SEM image obtained by SEM observation of a cross-section of a film in Comparative Example 3.

DETAILED DESCRIPTION OF THE PREFERRED EMBODIMENTS

An aligned film and a method for producing the aligned film of the present invention will be described in detail through some embodiments, but the present invention is not limited to these embodiments.

Embodiment 1

Figure 1:
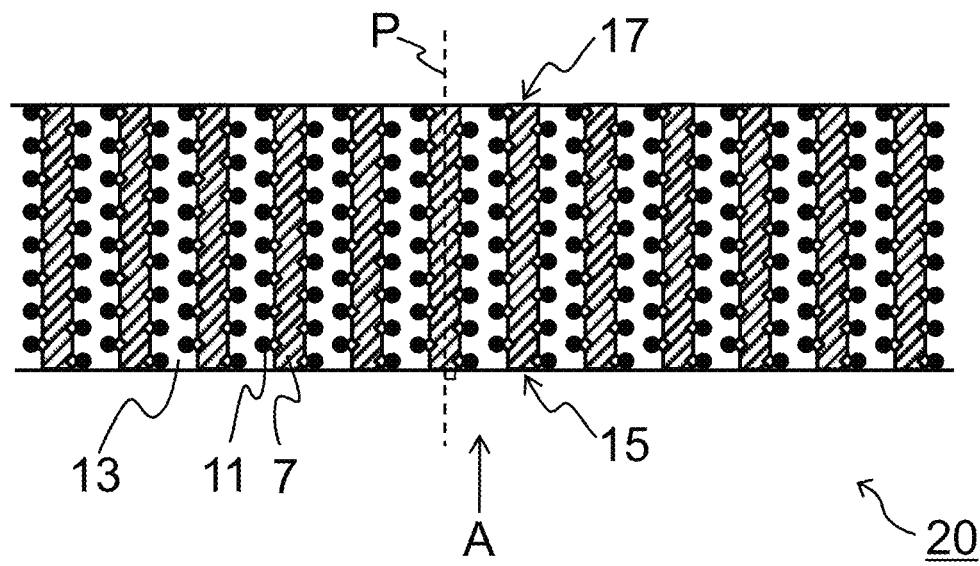
FIG. 1 is a schematic cross sectional view illustrating an aligned film in one embodiment of the present invention, and showing a state in which respective layers of MXene are perpendicularly aligned between first and second faces of the aligned film.
Figure 2:
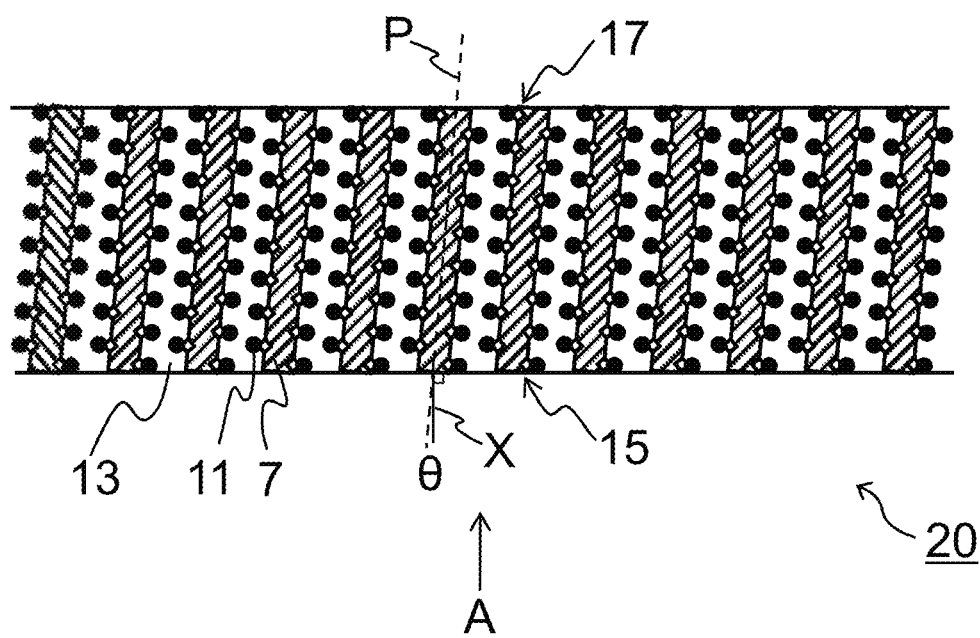
FIG. 2 is a schematic cross sectional view illustrating an aligned film in one embodiment of the present invention, and showing a state in which respective layers of MXene are aligned in an inclined manner between first and second faces of the aligned film.

Referring to FIGS. 1 and 2, an aligned film 20 of the present embodiment has a first face 15 and a second face 17 that are opposed to each other, the aligned film 20 including:

(a) a prescribed layered material including a plurality of layers 7 aligned non-parallel to the first face 15 and the second face 17 between the first face 15 and the second face 17; and (b) magnetic nanoparticles 11 carried on a layer surface of the plurality of layers 7 and/or between two adjacent layers 7.

A material usable as the prescribed layered material in the present embodiment is MXene, which is defined as follows:

A layered material including a plurality of layers, each layer having a crystal lattice represented:

$M_{n+1}X_n$ (wherein M is at least one metal of Group 3, 4, 5, 6, or 7 and may include at least one metal selected from the group consisting of so-called early transition metals, for example, Sc, Ti, Zr, Hf, V, Nb, Ta, Cr, Mo, and Mn;

X is a carbon atom, a nitrogen atom, or a combination thereof; and n is 1, 2, or 3), and in which each X is positioned in an octahedral array of M, and having at least one modifier or terminal T selected from the group consisting of a hydroxy group, a fluorine atom, an oxygen atom, and a hydrogen atom, preferably a hydroxy group, on at least one of two opposing surfaces of said each layer (this is also expressed as "$M_{n+1}X_nT_s$", wherein s is an arbitrary number, and conventionally, x may be used in place of s).

Such MXene can be obtained by selectively etching A atoms from an MAX phase. The MAX phase has a crystal lattice which is represented by the following formula:

$M_{n+1}AX_n$ (wherein M, X, and n are the same as described above; and A is at least one element of Group 12, 13, 14, 15, or 16, normally an element of A Group, typically of IIIA Group or IVA Group, more specifically at least one element selected from the group consisting of Al, Ga, In, Tl, Si, Ge, Sn, Pb, P, As, S, and Cd, and is preferably Al), and in which each X is positioned in an octahedral array of M, and has a crystal structure in which a layer constituted by A atoms is positioned between layers represented by $M_{n+1}X_n$. The MAX phase schematically includes a repeating unit in which each one of layers of X atoms is disposed between adjacent layers of n+1 layers of M atoms (these are also collectively referred to as a "$M_{n+1}X_n$ layer"), and a layer of A atoms ("A atom layer") is disposed as a layer next to the (n+1)th layer of M atoms. The A atom layer is removed by selectively etching A atoms from the MAX phase. The exposed surface of the $M_{n+1}X_n$ layer is modified by hydroxy groups, fluorine atoms, oxygen atoms, hydrogen atoms, or the like present in an etching liquid (an aqueous solution of fluorine-containing acid is typically used, but not limited to this), and thus the surface is terminated.

For example, the MAX phase is $Ti_3AlC_2$, and MXene is $Ti_3C_2T_s$.

In the present invention, MXene may contain remaining A atoms at a relatively small amount, for example, equal to or less than 10% by mass with respect to the original content of A atoms.

Figure 3:
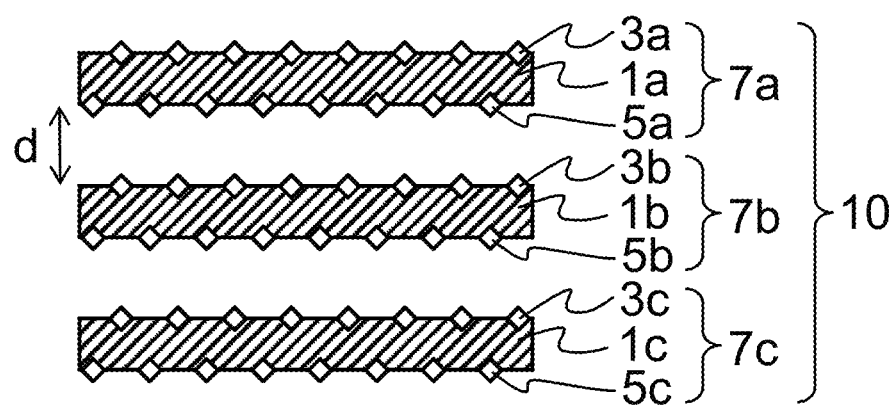
FIG. 3 is a schematic cross sectional view of MXene that is a layered material usable for an aligned film in one embodiment of the present invention.

As schematically illustrated in FIG. 3, MXene 10 obtained in this way may be a layered material including two or more (although three layers are illustrated in the figure as an example, this is not limiting) MXene layers (these are also represented by "$M_{n+1}X_nT_s$", and s is an arbitrary number) 7a, 7b, and 7c obtained by modifying or terminating the surfaces of $M_{n+1}X_n$ layers 1a, 1b, and 1c with modifiers or terminals T 3a, 5a, 3b, 5b, 3c, and 5c. The MXene 10 may be a plurality of MXene layers which are separated and individually present (single-layer structure), a laminate in which a plurality of MXene layers are laminated with gaps interposed therebetween (multi-layer structure), or a mixture thereof. MXene may be an aggregation (may be also referred to as particles, powder, or flakes) of individual MXene layers (single layers) and/or laminates of MXene layers. In the case of the laminate, two adjacent MXene layers (for example, 7a and 7b, and 7b and 7c) do not need to be completely separated, and may be partially in contact with each other.

Although the following description is not given to limit the present embodiment, each layer of MXene (corresponding to the MXene layers 7a, 7b, and 7c described above) has a thickness of, for example, not less than 0.8 nm and not more than 5 nm, and particularly not less than 0.8 nm and not more than 3 nm (the thickness may vary depending mainly on the number of M atom layers included in each layer), and the maximum dimension of MXene in a plane parallel to the layer (two-dimensional sheet plane) is, for example, not less than 0.1 μm and not more than 200 μm, particularly not less than 1 μm and not more than 40 μm. In the case where MXene is a laminate, as to each individual laminate, the in-between distance of the layers (or a gap dimension indicated by d in FIG. 3) is, for example, not less than 0.8 nm and not more than 10 nm and particularly not less than 0.8 nm and not more than 5 nm, and yet particularly about 1 nm, and the total number of layers may be 2 or more, and, for example, is not less than 50 and not more than 100,000 and particularly not less than 1,000 and not more than 20,000, the thickness in the lamination direction is, for example, not less than 0.1 μm and not more than 200 μm and particularly not less than 1 μm and not more than 40 μm, and the maximum dimension in a plane (two-dimensional sheet plane) perpendicular to the lamination direction is, for example, not less than 0.1 μm and not more than 100 μm and particularly not less than 1 μm and not more than 20 μm. To be noted, these dimensions are obtained as number average dimensions (for example, number average of at least 40 samples) based on a scanning electron microscope (SEM) image or a transmission electron microscope (TEM) image.

MXene has a remarkably high carrier density (carrier concentration) and a high electrical conductivity in an in-plane direction, and also has a high electrical conductivity (for example, compared with graphene) in the thickness direction because MXene contains metal atoms M. Further, since MXene contains metal atoms M, MXene also has a high thermal conductivity (for example, compared with graphene). In addition, MXene includes surface modifiers or terminals T that may be polar or ionic, and thus the surface thereof is highly hydrophilic. The contact angle of water on the surface of MXene may be, for example, 45° or less, and typically not less than 20° and not more than 35°.

Magnetic nanoparticles usable in the present embodiment are particles composed of a magnetic material, and have an average particle size in nano-order or less. The average particle size of the magnetic nanoparticles may be, for example, not less than 0.8 nm and not more than 50 nm, particularly not less than 0.8 nm and not more than 10 nm. To be noted, the average particle size is determined as a number average particle size (for example, a number average particle size of at least 40 samples) based on a scanning electron microscope (SEM) image or a transmission electron microscope (TEM) image.

Examples of the magnetic material that forms the magnetic nanoparticles include materials having a magnetic permeability of 100 or more, specifically nickel, iron, cobalt and ferrite. The magnetic material may be either one having relatively high electrical conductivity (e.g., nickel, iron, cobalt or the like) or one having relatively low electrical conductivity (e.g., ferrite or the like), and may be appropriately selected according to an application of the aligned film. The magnetic nanoparticles may be composed of one of these materials or a combination of two or more of these materials. In the latter case, the nanoparticles may have a core-shell structure.

Figure 4:
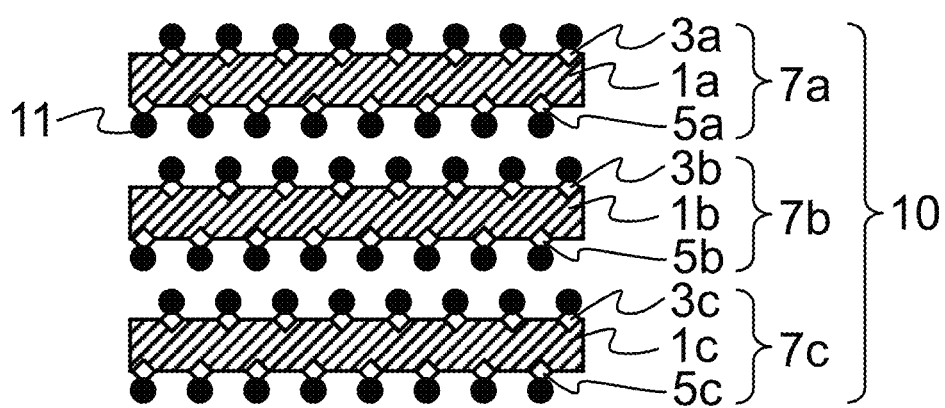
FIG. 4 is a schematic cross sectional view illustrating MXene as a layered material usable for an aligned film in one embodiment of the present invention, and showing a state in which magnetic nanoparticles are carried on MXene.

In the aligned film of the present embodiment, the magnetic nanoparticles are carried on the layer surface and/or between two adjacent layers of the plurality of layers of MXene (i.e., MXene layers). As schematically shown in, for example, FIGS. 1, 2 and 4, magnetic nanoparticles 11 (shown by black circles in the drawing) are carried on the surface of the MXene layers 7, 7a, 7b and 7c and/or between two adjacent MXene layers 7, between MXene layers 7a and 7b and between MXene layers 7b and 7c (it is to be noted that it is not necessary that magnetic nanoparticles are carried on the layer surface of all the existing layers and between every two adjacent layers). The magnetic nanoparticles may be carried as described above, and may be carried on the layer surface of MXene layers via the modifier or terminal T (at least one of, and normally both of, the modifiers or terminals T 5a and 3b and 5b and 3c in FIG. 4) (here, T can be understood as a linking group or linking element rather than a terminal). This is because the modifier or terminal T is primarily negatively charged, so that the magnetic nanoparticles can be effectively caught under an electrical action. The modifier or terminal T may be present periodically or regularly depending on the crystal structure of $M_{n+1}X_n$, and therefore it is possible to periodically or regularly carry the magnetic nanoparticles at a position of the modifier or terminal T. That is, the magnetic nanoparticles can be carried while being substantially uniformly dispersed in MXene (more specifically, MXene layer). As the magnetic nanoparticles, those that are easily caught by the modifier or terminal T can be selected. It is to be noted that graphene has no regularly disposed polar or ionic modifier or terminal etc., and therefore magnetic nanoparticles cannot be carried while being substantially uniformly dispersed.

The ratio of carried magnetic nanoparticles is not particularly limited, but may be, for example, not less than 0.1 parts by mass and not more than 30 parts by mass, particularly not less than 1 part by mass and not more than 15 parts by mass, based on 100 parts by mass of MXene.

Referring to FIGS. 1 and 2, in the aligned film 20 of the present embodiment, a plurality of MXene layers 7 carrying the magnetic nanoparticles 11 are aligned non-parallel to the first face 15 and the second face 17 of the aligned film 20, which are opposed to each other, between the faces 15 and 17. The phrase a MXene layer is "aligned non-parallel to" a face (or plane) may mean any of states in which the MXene layer is not parallel to the face, and for example, the MXene layer may be inclined or perpendicular as a whole to the face, or may be partially bent or curved. In the aligned film 20 of the present embodiment, the first face 15 and the second face 17 are normally parallel to each other, but the present embodiment is not limited thereto. When the first face 15 and the second face 17 are not parallel to each other, the plurality of MXene layers 7 may be non-parallel to at least one, preferably both, of the first face 15 and the second face 17.

In the aligned film 20 of the present embodiment, the first face 15 and the second face 17 may be principal planes of the aligned film 20, and due to such a characteristic that the plurality of MXene layers 7 are aligned non-parallel to the first face 15 and the second face 17, a gap between two adjacent MXene layers 7 is "opened" with respect to the principal planes of the aligned film 20, and such a gap can be used for exhibiting various characteristics of MXene. Therefore, the aligned film 20 of the present embodiment can be suitably used for various applications including, for example, an electromagnetic shielding and an electrode of a capacitor or a battery, as described later.

Depending on an application of the aligned film, it is preferable that the plurality of MXene layers 7 are aligned perpendicularly, or in an inclined manner at an angle of not more than 80 degrees with respect to a perpendicular direction between the first face 15 and the second face 17. Herein, the angle with respect to the perpendicular direction refers to an angle formed by a direction perpendicular to the first face 15 and/or the second face 17 and a surface of the MXene layer 7 (two-dimensional plane surface; represented by a dotted line P in the drawing). This angle is 0 degree (i.e., the layer is aligned perpendicularly to the first face 15 and/or the second face 17) as shown in FIG. 1, or the angle is an angle of less than 90 degrees (shown as an angle θ formed between the direction perpendicular to the first face 15 and a plane P of the MXene layer 7 in the drawing) as shown in FIG. 2, and specifically, the angle is not more than 80 degrees, particularly not more than 60 degrees.

In FIGS. 1 and 2, the plurality of MXene layers 7 are shown in a state of being aligned parallel to one another, but the present embodiment is not limited thereto. In the case of a laminate of MXene layers, the MXene layers can be aligned parallel to one another along the lamination direction in one laminate, but laminates are not necessarily aligned parallel to one another, and the lamination direction of one laminate and the lamination direction of another laminate may be parallel to each other or may form an angle, preferably in one plane (e.g., when viewed from the top of the aligned film). In addition, in FIGS. 1 and 2, each of the plurality of MXene layers 7 is shown in a state of being aligned on a line in a cross-section, but the present embodiment is not limited thereto. A plurality of MXene layers may be partially bent or curved in a cross-section. When the MXene layers are individually separated layers, the MXene layers may be more free, and the perpendicular direction of one MXene layer and the perpendicular direction of another Mxene layer and/or the lamination direction of one laminate may be parallel to each other or may form an angle, preferably in one plane (e.g., when viewed from the top of the aligned film).

Figure 9:
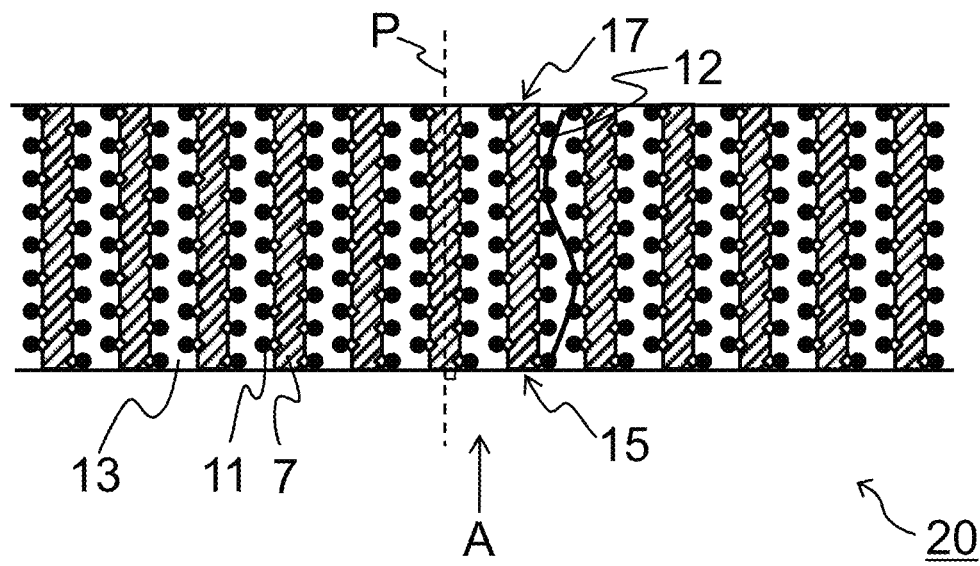
FIG. 9 is a schematic cross sectional view illustrating an aligned film in a further embodiment of the present invention, and showing a state in which respective layers of MXene are perpendicularly aligned between first and second faces of the aligned film and carbon nanotubes are within the aligned film.
Figure 10:
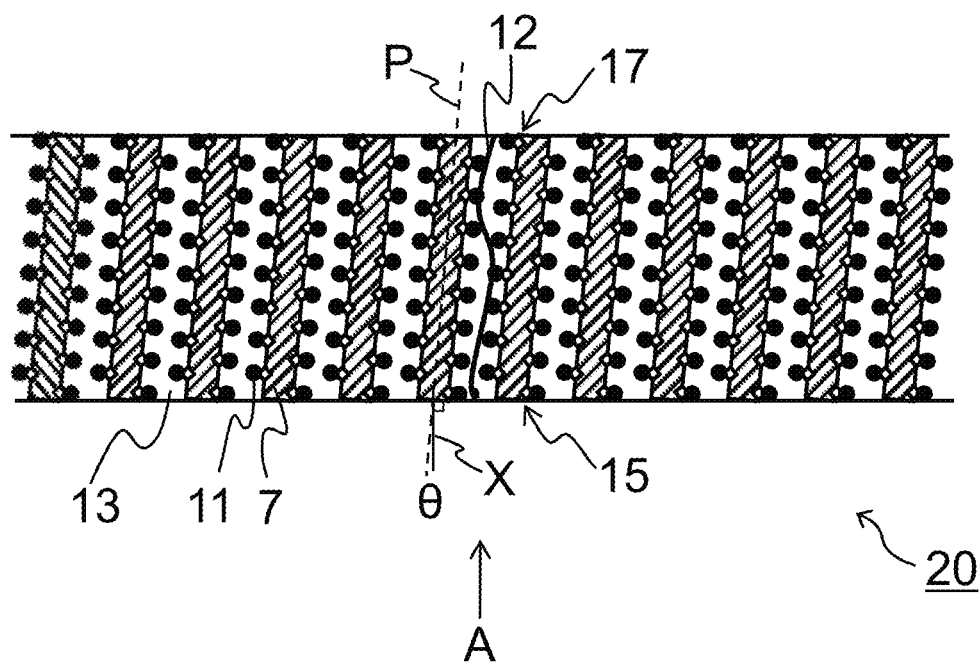
FIG. 10 is a schematic cross sectional view illustrating an aligned film in one embodiment of the present invention, and showing a state in which respective layers of MXene are aligned in an inclined manner between first and second faces of the aligned film and carbon nanotubes are within the aligned film.

In addition, the aligned film of the present embodiment may further contain other components. For example, as shown in FIGS. 9 and 10, the aligned film 20 may further contain carbon nanotubes 12. Carbon nanotubes are each a material formed in a tube shape from a single layer or multiple layers of graphene sheets, and has a diameter (outer diameter) in the order of nanometers or less. By adding carbon nanotubes 12, the electrical conductivity of the aligned film 20 can be kept high even when the magnetic nanoparticles are carried. The carbon nanotubes 12 may be carried on the surface and/or between two adjacent layers 7 of a plurality of layers of MXene as in the case of the magnetic nanoparticles 11 described above. Although the dimension of the carbon nanotubes 12 may be selected as appropriate, the average diameter thereof may be, for example, not less than 0.5 nm and not more than 200 nm and particularly not less than 1 nm and not more than 50 nm, and the average length thereof may be, for example, not less than 0.5 µm and not more than 200 µm and particularly not less than 1 µm and not more than 50 µm. To be noted, these dimensions are obtained as number average dimensions (for example, number average of at least 40 samples) based on a scanning electron microscope (SEM) image or a transmission electron microscope (TEM) image.

The ratio of carried carbon nanotubes is not particularly limited, but may be, for example, not less than 1 part by mass and not more than 50 parts by mass and particularly not less than 1 part by mass and not more than 10 parts by mass, based on 100 parts by mass of MXene.

In addition, for example, the aligned film of the present embodiment may contain an arbitrary appropriate forming material, for example, a binder, and may contain an additive (for example, a viscosity modifier, a curing agent, or the like) in some cases. Referring to FIGS. 1 and 2, gaps 13 in the plurality of MXene layers 7 may be impregnated with a molding material, and the plurality of MXene layers 7 may be embedded in a molding material together with the magnetic nanoparticles 11, and may be either fully covered or partially exposed.

The binder may be a hydrophilic organic binder. The hydrophilic organic binder or precursor thereof has good wettability on MXene having a hydrophilic surface, and thus MXene can be easily dispersed in the organic binder and the organic binder can be easily impregnated between the layers of MXene. Therefore, the organic binder may be suitably used. In the case of a laminate of MXene, when the organic binder or precursor thereof is impregnated between the layers of MXene, the in-between distance of the respective layers of MXene can be increased, but this in not limiting.

Examples of the hydrophilic organic binders include polymers such as polypyrrole, (meth)acrylic resin, and cellulose, thermosetting resins such as polyvinyl butyral and polyester, and curable resins such as phenol-curable epoxy resin and polyurethane. These polymers (or polymeric materials) and/or resins may contain other monomer units and any suitable substituents and/or modifying groups. As the precursor of the hydrophilic organic binder, for example, a monomer such as pyrrole can be used.

Alternatively, referring to FIGS. 1 and 2, the gaps 13 of the plurality of MXene layers 7 may be spaces.

The aligned film of the present embodiment may be a free standing film, but is not limited thereto. For example, the aligned film may be formed on a base material. The base material is not particularly limited, and may be appropriately selected according to an application of the aligned film, and may be, for example, a carrier film, a release layer, a member to be shielded (when the aligned film is used as an electromagnetic shielding), an electrically conductive member (when the aligned film is used as an electrode), or the like.

Use as Electromagnetic Shielding

The aligned film of the present embodiment can be used as, for example, an electromagnetic shielding.

The electromagnetic shielding is a member that is used to prevent an electromagnetic wave (electromagnetic noise) generated from an electronic device or the like, from being spatially transmitted and causing other or the same electronic device or the like to malfunction. MXene is a layered material and has high electromagnetic wave absorbing performance due to internal multiple reflection of electromagnetic waves, and therefore can be used as a material that forms an electromagnetic shielding. Since MXene has a high electrical conductivity in the thickness direction (e.g., as compared to graphene), conduction between MXene layers (single layers and/or laminates) is more likely to be achieved (for example, in either case of MXene alone or a film in which MXene is dispersed in an organic binder such as a resin or polymer), and thus a high shielding effect can be achieved.

In the aligned film of the present embodiment, the plurality of MXene layers are aligned non-parallel to the first face and the second face as principal planes of the aligned film as described above, and therefore when the aligned film is exposed to electromagnetic waves, the electromagnetic waves easily enter between MXene layers, so that electromagnetic waves internally reflected between MXene layers can be efficiently absorbed. As a result, electromagnetic waves reflected by the aligned film as an electromagnetic shielding (reflection component) can be reduced, i.e., the ratio of the reflection component to the total shielding effect can be reduced, and therefore influences on electronic devices etc. (more specifically, members that form an electronic circuit) in the electromagnetic shielding can be effectively reduced or prevented.

Referring to FIG. 2, when the aligned film of the present embodiment is used as an electromagnetic shielding in such a manner that electromagnetic waves are incident from the first face 15 toward the second face 17 of the aligned film (the incident direction is shown by arrow A in the drawing), it is preferable that a plurality of MXene layers 10 are inclined while forming an angle of more than 0 degree and not more than 80 degrees with respect to a direction perpendicular to the first face 15. As a result, electromagnetic waves passing through the aligned film as an electromagnetic shielding (transmission component) can be reduced, so that a higher shielding effect (total shielding effect) can be obtained.

Further, in the aligned film of the present embodiment, magnetic nanoparticles are carried on the surface of the plurality of MXene layers and/or between two adjacent MXene layers as described above, and therefore when the aligned film is exposed to electromagnetic waves, electromagnetic waves internally reflected between the MXene layers can be brought into contact with the magnetic nanoparticles carried on the layer surface and/or between two adjacent layers, so that preferably, the chances of electromagnetic waves coming into contact with the magnetic nanoparticles can be increased due to multiple reflection specific to MXene. Due to the contact between the electromagnetic waves and the nanoparticles, magnetic field energy of the electromagnetic waves can be converted into heat, thus attenuated and absorbed by means of the effect of a magnetic loss depending on the magnetic nanoparticles to be used (generated heat can be effectively dissipated by high thermal conductivity of MXene). As a result, electromagnetic waves absorbed by the aligned film as an electromagnetic shielding (absorption component) can be increased, so that a higher shielding effect (total shielding effect) can be obtained.

In addition, in the aligned film of the present embodiment, the magnetic nanoparticles can be periodically or regularly carried at the position of the modifier or terminal T, and carried while being substantially uniformly dispersed in MXene, so that a shielding effect controlled as desired can be obtained.

Use as Electrode

The aligned film of the present embodiment can be used as, for example, an electrode of a capacitor or a battery, particularly as an electrode of an electrochemical capacitor, for example a pseudocapacitor, or a magnesium/lithium ion battery.

An electrode of a capacitor or a battery is a member which is used while being immersed in an electrolytic solution so that ions of an electrolyte contained in the electrolytic solution are attracted and caught by the electrode to exhibit a capacity or a potential difference. MXene is a layered material and able to catch ions of an electrolyte between MXene layers by intercalation, and therefore may be used as a material that forms such an electrode. The electrode may be in the form of a film having two principal planes opposed to each other, and is normally disposed in such a manner that one of the principal planes faces another electrode which forms a counterpart, and ions of an electrolyte are transported toward the principal plane of the electrode in the electrolytic solution.

In the aligned film of the present embodiment, the plurality of MXene layers are aligned non-parallel to the first face and the second face as principal planes of the aligned film as described above, and therefore when a capacitor or battery is activated with the aligned film immersed in an electrolytic solution, ions of an electrolyte easily enter between MXene layers, so that the ions of the electrolyte can be easily caught between MXene layers. As a result, the capacity can be effectively inhibited from being reduced when the thickness of the aligned film as an electrode is made larger.

Referring to FIG. 1, when the aligned film of the present embodiment is used as an electrode in such a manner that ions of an electrolyte are transported from the first face 15 toward the second face 17 of the aligned film (the transportation direction is shown by arrow A in the drawing), it is preferable that the plurality of MXene layers 10 may be aligned perpendicularly to the first face 15, or inclined while forming an angle of more than 0 degree and not more than 80 degrees with respect to a direction perpendicular to the first face 15. The inclination angle is preferably as small as possible because ions of an electrolyte more easily enter between MXene layers, and the angle is more preferably a right angle.

In addition, in the aligned film of the present embodiment, the magnetic nanoparticles can be periodically or regularly carried at the position of the modifier or terminal T, and carried while being substantially uniformly dispersed in MXene, so that more uniform electrode performance (e.g., electrical capacity distribution) can be obtained.

Embodiment 2

The present embodiment relates to one method for producing the aligned film described in Embodiment 1. In the present embodiment, magnetic nanoparticles prepared beforehand are used. Those that have been described in Embodiment 1 also apply to the present embodiment unless any particular description is given.

First, a dispersion with at least magnetic nanoparticles dispersed in a liquid medium is prepared. The same magnetic nanoparticles as described in Embodiment can be used. The liquid medium may be any of a hydrophilic binder or a precursor thereof, an aqueous liquid medium (e.g., water or any suitable aqueous composition) and a hydrophilic organic liquid medium (e.g., alcohol, typically ethanol, methanol or the like), or a mixture of two or more thereof, and may contain an additive or the like as appropriate. A dispersion with magnetic nanoparticles and carbon nanotubes dispersed in a liquid medium may also be prepared. The content ratio of the magnetic nanoparticles, and the content ratio of the carbon nanotubes if present, in the dispersion can be appropriately selected according to performance desired for the aligned film.

Next, MXene is disposed in the dispersion prepared as described above. More specifically, the dispersion prepared as described above and MXene are mixed to disperse MXene in the dispersion, and the dispersion is impregnated between the layers of MXene. At this time, MXene may be dispersed in the liquid medium beforehand, and then mixed with the dispersion prepared as described above. Alternatively, in preparation of the dispersion as described above, MXene may be added to the liquid medium along with the magnetic nanoparticles, or MXene and the magnetic nanoparticles may be mixed beforehand and added to the liquid medium.

Since the liquid medium that forms the dispersion is hydrophilic or aqueous, the liquid medium has a good wettability on MXene having a hydrophilic surface, and thus MXene can be easily dispersed in the liquid medium (even without any dispersing agent), and the liquid medium can be easily impregnated between the layers of MXene. Accordingly, the magnetic nanoparticles in the dispersion, together with the liquid medium, can be easily supplied to the surface of layers and/or between two adjacent layers in MXene. It is preferable to use a hydrophilic organic binder or a precursor thereof as the liquid medium because subsequent molding (e.g., film molding) is easy.

As the magnetic nanoparticles, those that are easily caught by the modifier or terminal T can be selected. In the present embodiment, for example, positively chargeable magnetic nanoparticles are used and positively charged in a dispersion through any suitable method, and then MXene is further dispersed in the dispersion, so that the positively charged dielectric/magnetic nanoparticles can be easily caught by a principally negatively charged modifier or terminal T. Typically, particles with at least a surface composed of ferrite or the like are used as magnetic nanoparticles, and the dispersion is made acidic by a pH adjusting agent (e.g., hydrochloric acid or potassium hydroxide) etc., whereby the surface of ferrite or the like can be positively charged.

In addition, by using a hydrophilic or cationic monomer as the precursor of a hydrophilic organic binder in the liquid medium, dielectric/magnetic nanoparticles can be easily caught by a principally negatively charged modifier or terminal T. For example, by preparing beforehand a dispersion with magnetic nanoparticles dispersed in a hydrophilic or cationic monomer (here, it is not necessarily required that the magnetic nanoparticles are polar/charged), and then MXene is further dispersed in the dispersion, so that a monomer having a positive charge is easily caught by a principally negatively charged modifier or a terminal T. At this time, the monomer having a positive charge is accompanied by the magnetic nanoparticles, and as a result, the dielectric/magnetic nanoparticles can be caught by the modifier and terminal T together with the monomer. Typically, pyrrole can be used as the precursor of a hydrophilic organic binder.

In this case, the modifier or terminal T may be present periodically or regularly depending on the crystal structure of $M_{n+1}X_n$, and therefore it is possible to periodically or regularly carry the magnetic nanoparticles at a position of the modifier or terminal T. That is, the magnetic nanoparticles can be carried while being substantially uniformly dispersed in MXene.

A magnetic field is applied to the mixture obtained as described above and containing MXene, the magnetic nanoparticles and the liquid medium, so that a plurality of MXene layers are aligned parallel to a predetermined direction. Here, the predetermined direction may be non-parallel to the first face and the second face of the aligned film that is ultimately obtained, and the predetermined direction can be appropriately set according to performance desired for the aligned film. The plurality of MXene layers can be aligned along the magnetic field direction by matching the magnetic field direction to the predetermined direction.

Under normal gravity, MXene dispersed in the liquid medium, when being in the form of either a single layer or a laminate, is easily oriented in such a manner that the two-dimensional sheet plane is generally parallel, and thus MXenes as single layers and/or laminates may be stacked as a whole. However, the MXene layer has anisotropy in its magnetic susceptibility, and further, the magnetic susceptibility is increased by carrying the magnetic nanoparticles, so that by applying a magnetic field, the MXene layer can be easily aligned even when the magnetic field is relatively weak. In addition, in the aligned film of the present embodiment, the magnetic nanoparticles can be periodically or regularly carried at the position of the modifier or terminal T, and carried while being substantially uniformly dispersed in MXene, so that the magnetic susceptibility of the MXene layer can be uniformly improved over the whole layer while the anisotropy of the magnetic susceptibility of the MXene layer is retained, and thus it is easy to control magnetic field alignment.

Thereafter, the mixture obtained by the above-mentioned operation and containing MXene, the magnetic nanoparticles and the liquid medium is molded into a form of an aligned film. For example, by at least partially removing the liquid medium from the mixture (e.g., removing the liquid medium by drying), or at least partially curing the mixture (e.g., curing the organic binder, or curing the precursor of the organic binder (curing may include polymerization)), an aligned film can be obtained. The aligned film may be obtained in the form of a coating layer by performing the above-mentioned operation on a base material.

Thus, an aligned film with magnetic nanoparticles carried on MXene is produced.

Embodiment 3

The present embodiment relates to another method for producing the aligned film described in Embodiment 1. In the present embodiment, magnetic nanoparticles are precipitated on the surfaces of MXene layers or in the vicinity thereof. Those that have been described in Embodiments 1 and 2 also apply to the present embodiment unless any particular description is given.

First, a liquid matter containing at least magnetic precursor ions in a liquid medium is prepared. As a magnetic precursor ion, any suitable ion may be used as long as magnetic nanoparticles can be precipitated in the following. The liquid medium may be an aqueous liquid medium, a hydrophilic organic medium, or a mixture of two or more thereof, and may contain an additive or the like as appropriate. A liquid matter containing magnetic precursor ions and carbon nanotubes in a liquid medium may be prepared. The content ratio of the magnetic precursor ions, and the content ratio of the carbon nanotubes if present, in the liquid can be appropriately selected according to performance desired for the aligned film.

Next, MXene is disposed in the liquid matter prepared as described above, and magnetic nanoparticles are precipitated by using precursor ions.

Since the liquid medium that forms the liquid matter is hydrophilic or aqueous, the liquid medium has a good wettability on MXene having a hydrophilic surface, and thus MXene can be easily dispersed in the liquid medium (even without any dispersing agent), and the liquid medium can be easily impregnated between the layers of MXene. Accordingly, the precursor ions in the liquid matter, together with the liquid medium, can be easily supplied to the surface of layers and/or between two adjacent layers in MXene to precipitate magnetic nanoparticles at such sites. It is preferable to use an aqueous liquid medium as the liquid medium because it is stable as a reaction field.

More specifically, when magnetic precursor ions are used, magnetic nanoparticles can be precipitated by reducing the precursor ions. For example, when cations such as metal ions are used as precursor ions in the present embodiment, the cation precursor ions are easily caught by the modifier or terminal T of MXene because the modifier or terminal T of MXene is principally negatively charged. Further, since the modifier or terminal T has catalytic activity, the precursor ions are easily reduced on the modifier or terminal T, so that magnetic nanoparticles can be precipitated in situ. The modifier or terminal T may be present periodically or regularly depending on the crystal structure of $M_{n+1}X_n$, and therefore it is possible to periodically or regularly carry the magnetic nanoparticles at a position of the modifier or terminal T. That is, the magnetic nanoparticles can be carried while being substantially uniformly dispersed in MXene.

Here, the precursor ions may be ions capable of precipitating magnetic nanoparticles, and may include, for example, at least one selected from the group consisting of a nickel ion, an iron ion and a cobalt ion, and the magnetic nanoparticles precipitated therefrom are particles containing nickel, iron and cobalt, respectively. The precursor ion source may be an ion bonding compound including the above-mentioned precursor ions, for example, a sulfate, and precursor ions can be generated by dissolving the ion bonding compound in a liquid medium, preferably an aqueous liquid medium (solvent).

Reduction of precursor ions may be performed in the presence of a reducing agent, although any suitable method is applicable. As the reducing agent, for example, hydrazine can be used. More specifically, when such a reducing agent is added to a dispersion liquid in which MXene is dispersed in an aqueous liquid medium, and in which a sulfate (e.g., nickel sulfate) capable of generating precursor ions is dissolved in the aqueous liquid medium (solvent), the reducing agent is oxidized and the precursor ions are reduced on the above-mentioned modifier or terminal T (having catalytic activity) of MXene, so that magnetic nanoparticles are precipitated.

A magnetic field is applied to the mixture obtained as described above and containing MXene, magnetic nanoparticles and a liquid medium, so that a plurality of MXene layers are aligned parallel to a predetermined direction. Regarding the magnetic field alignment, the description in Embodiment 2 also applies to the present embodiment.

Thereafter, the mixture obtained by the above-mentioned operation and containing MXene, the magnetic nanoparticles and the liquid medium is molded into a form of an aligned film. For example, by at least partially removing the liquid medium from the mixture (e.g., removing the liquid medium by drying), an aligned film can be obtained. The aligned film may be obtained in the form of a coating layer by performing the above-mentioned operation on the base material.

In addition, for example, by at least partially curing the above-mentioned mixture (e.g., curing the organic binder), an aligned film can be obtained. In this case, the aligned film can be obtained by adding a hydrophilic organic binder to the mixture obtained as described above and containing MXene, the magnetic nanoparticles and the liquid medium (preferably an aqueous liquid medium), optionally at least partially removing the liquid medium from the mixture (addition of the organic binder and removal of the liquid medium may be performed sequentially in any order, at the same time, or in a partially overlapping manner) before applying a magnetic field, and then applying the magnetic field to align a plurality of MXene layers parallel in a predetermined direction, and then at least partially removing the liquid medium if remaining (e.g., removing the liquid medium by drying) from the mixture, or curing the mixture (e.g., curing the organic binder). The aligned film may be obtained in the form of a coating layer by performing the above-mentioned operation on a base material.

Thus, an aligned film with magnetic nanoparticles carried on MXene is produced.

However, the aligned film described in Embodiment 1 is not limited to be produced by the production method described in Embodiment 2 or 3, and may be produced via any other appropriate method.

EXAMPLES

Example 1

A commercially available ferrofluid EMG 508 (manufactured by Ferrotec Corporation) was prepared as a dispersion with magnetic nanoparticles dispersed in a liquid medium. The ferrofluid is a colloidal dispersion containing 1.2% by volume of particles (nominal particle size 10 nm) of magnetite ($Fe_3O_4$), which is one of ferrite, in a water medium. The ferrofluid had a black-brown appearance, included an anionic surfactant, and had a density of 1.07 g/cc at 25° C.

On the other hand, a dispersion containing $Ti_3C_2T_s$ as MXene in water was obtained in the following manner.

First, 1 g of $Ti_3AlC_2$ synthesized in accordance with the procedure disclosed in Patent Literature 3 was immersed in an etching liquid obtained by mixing 1 g of LiF and 10 cc of 6 mol/L hydrochloric acid, so that $Ti_3AlC_2$ was subjected to etching. The etching was performed for 24 hours while the etching liquid was kept at 35° C., and stirred by a magnetic stirrer. After the etching, the deposit thus obtained was washed with water to obtain $Ti_3C_2T_s$ in the form of a clay-like material.

Then, 50 mg of the clay-like $Ti_3C_2T_s$ thus obtained was weighed in a container, 10 mL of water was added thereto, and dispersion was performed by an ultrasonic cleaner (Heated Ultrasonic Cleaner, manufactured by SHARPERTEK) to prepare a dispersion liquid containing $Ti_3C_2T_s$ in water (hereinafter, referred to simply as a "$Ti_3C_2T_s$-aqueous dispersion liquid"). The ultrasonic cleaning was performed for 1 hour while the above-mentioned container was cooled in an ice-water bath. After the ultrasonic cleaning, $Ti_3C_2T_s$ had a particle size of 400 to 800 nm (number average size of 40 particles based on a TEM photograph).

To the container containing the $Ti_3C_2T_s$-aqueous dispersion liquid (50 mg-10 mL) prepared as described above, 0.1 mL of the ferrofluid prepared as described above was added, and the mixture was mixed by a magnetic stirrer. Accordingly, a mixture was obtained which is substantially composed of $Ti_3C_2T_s$, $Fe_3O_4$ particles and water as MXene, magnetic nanoparticles and a liquid medium, respectively (see Table 1).

Figure 5A:
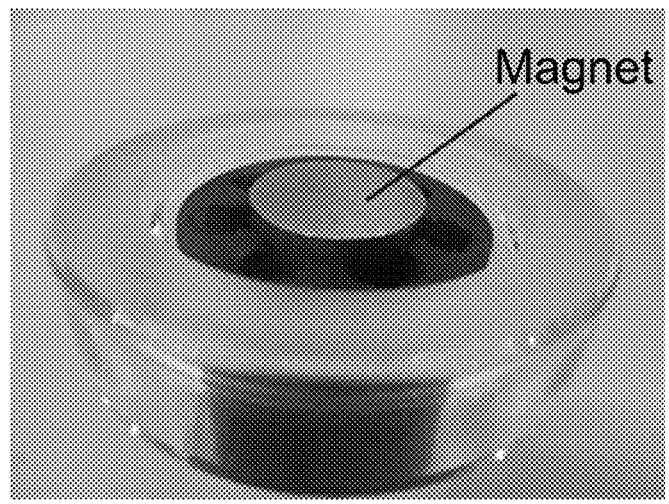
FIG. 5A is a photograph for illustrating a filter used for applying a magnetic field in each of examples and comparative examples, the photograph showing a state in which a neodymium magnet is disposed in a filter support member.
Figure 5B:
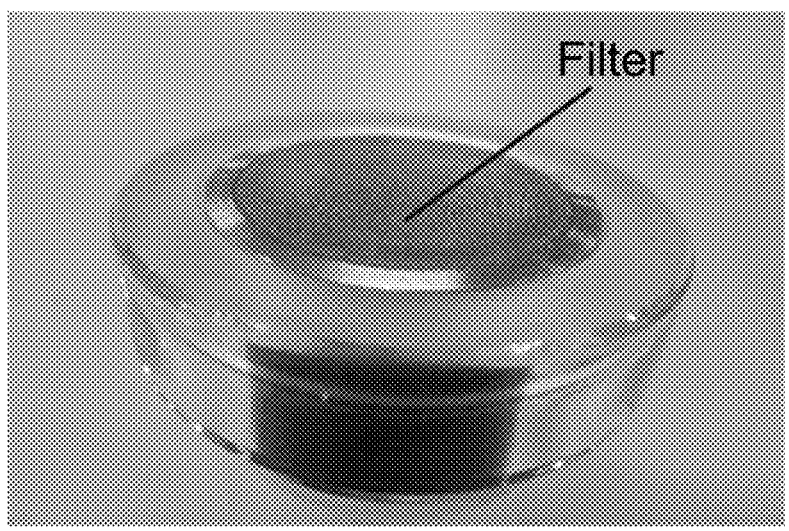
FIG. 5B is a photograph for illustrating a filter used for applying a magnetic field in each of examples and comparative examples, the photograph showing a state in which a filter is set in a filter support member.

The mixture thus obtained was subjected to suction filtration by a filter (polypropylene membrane filter, pore diameter: 0.064 μm, manufactured by Celgard). At the time, as shown in FIG. 5A, a neodymium magnet was disposed in a cylindrical filter support member, and a filter was disposed on the magnet as shown in FIG. 5B, whereby a magnetic field was applied to the mixture on the filter. At the time, the magnetic flux density was set to 12 kG. The liquid medium substantially composed of water was remove from the mixture by suction filtration to obtain a film as a residue on the filter. The film was composed of $Ti_3C_2T_s$ and $Fe_3O_4$ particles. The content ratio of $Fe_3O_4$ particles in this film was about 11% by weight as a calculated value.

Observation of a cross-section of the resulting film with SEM revealed that the film had a layered structure, and a plurality of layers were aligned non-parallel to a surface (principal plane) of the film.

Example 2

Except that the addition amount of ferrofluid was changed to 0.25 mL (see Table 1), the same procedure as in Example 1 was carried out to obtain a film. The content ratio of $Fe_3O_4$ particles in this film was about 24% by weight as a calculated value.

Observation of a cross-section of the resulting film with SEM revealed that the film had a layered structure, and a plurality of layers were aligned non-parallel to a surface (principal plane) of the film.

Comparative Example 1

Except that a $Ti_3C_2T_s$-aqueous dispersion liquid (50 mg-10 mL) was used as it was without adding ferrofluid thereto (see Table 1), and a neodymium magnet was not disposed in the filter support member (thus, a magnetic field was not applied), the same procedure as in Example 1 was carried out to obtain a film.

Observation of a cross-section of the resulting film with SEM revealed that the film had a layered structure, and a plurality of layers were aligned substantially parallel to a surface (principal plane) of the film.

TABLE 1

|  | Example 1 | Example 2 | Comparative Example 1 |
| --- | --- | --- | --- |
| $Ti_3C_2T_s$ | 50 mg | 50 mg | 50 mg |
| Water | 10 mL | 10 mL | 10 mL |
| Ferrofluid (= $Fe_3O_4$ particles + water) | 0.1 mL | 0.25 mL | — |

Example 3

Nanoparticles composed of nickel (average particle size: about 20 nm) were prepared as magnetic nanoparticles.

On the other hand, a dispersion containing $Ti_3C_2T_s$ as MXene in water was obtained in the following manner.

First, 1 g of $Ti_3AlC_2$ synthesized in accordance with the procedure disclosed in Patent Literature 3 was immersed in an etching liquid obtained by mixing 1 g of LiF and 10 cc of 9 mol/L hydrochloric acid, so that $Ti_3AlC_2$ was subjected to etching. The etching was performed for 24 hours while the etching liquid was kept at 35° C., and stirred by a magnetic stirrer. After the etching, the deposit thus obtained was washed with water to obtain $Ti_3C_2T_s$ in the form of a clay-like material.

Then 24 mg of the clay-like $Ti_3C_2T_s$ thus obtained was weighed in a container, 40 mL of water was added thereto, and dispersion was performed by shaking the container with hand for 10 minutes to prepare a dispersion liquid containing $Ti_3C_2T_s$ in water (hereinafter, referred to simply as a "$Ti_3C_2T_s$-aqueous dispersion liquid"). After the container was shaken with hand, $Ti_3C_2T_s$ had a particle size of 1 to 10 μm (number average size of 40 particles based on a TEM photograph).

To the container containing the $Ti_3C_2T_s$-aqueous dispersion liquid (24 mg-40 mL) prepared as described above, 2.5 mg of the nickel particles prepared as described above was added, and the mixture was mixed by a magnetic stirrer. Accordingly, a mixture was obtained which is composed of $Ti_3C_2T_s$, nickel particles and water as MXene, magnetic nanoparticles and a liquid medium, respectively.

The mixture obtained as described above was subjected to suction filtration in the same manner as in Example 1. The liquid medium substantially composed of water was removed from the mixture by suction filtration to obtain a film as a residue on the filter. The film was composed of $Ti_3C_2T_s$ and nickel particles. The content ratio of nickel particles in this film was about 9% by weight as a calculated value.

Figure 6A:
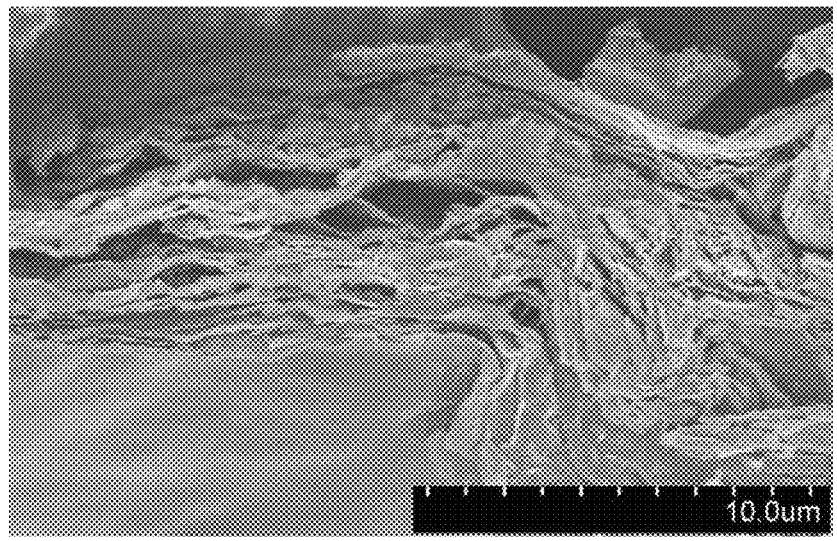
FIG. 6A shows one typical SEM image obtained by SEM observation of a cross-section of a film in Example 3.
Figure 6B:
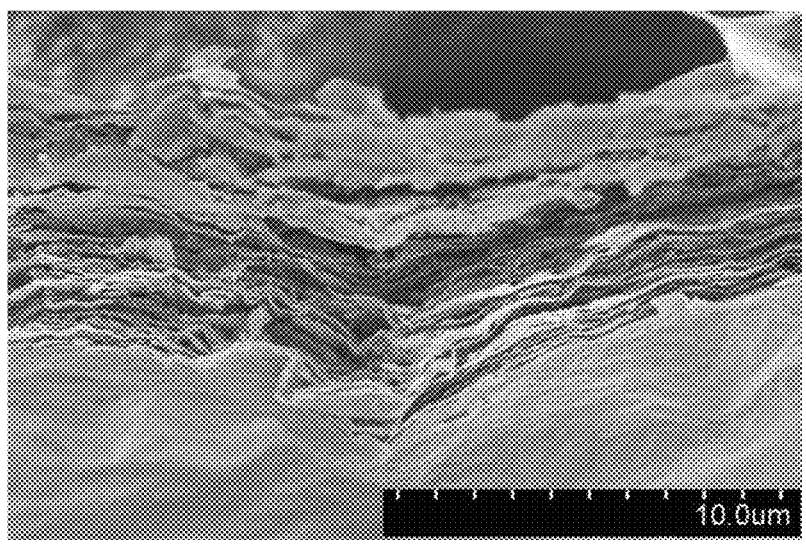
FIG. 6B shows another typical SEM image obtained by SEM observation of a cross-section of the film in Example 3.

A cross-section of the resulting film was observed with SEM. Two typical SEM images are shown in FIGS. 6A and 6B. As is understood from FIGS. 6A and 6B, it was confirmed that the film had a layered structure, and a plurality of layers were aligned non-parallel to a surface (principal plane) of the film.

Comparative Example 2

Except that a $Ti_3C_2T_s$-aqueous dispersion liquid (24 mg-40 mL) was used as it was without adding nickel particles thereto, and a neodymium magnet was not disposed in the filter support member (thus, a magnetic field was not applied), the same procedure as in Example 3 was carried out to obtain a film.

A cross-section of the resulting film was observed with SEM. One typical SEM image is shown in FIG. 7. As is understood from FIG. 7, it was confirmed that the film had a layered structure, and a plurality of layers were aligned substantially parallel to a surface (principal plane) of the film.

Comparative Example 3

Except that a $Ti_3C_2T_s$-aqueous dispersion liquid (24 mg-40 mL) was used as it was without adding nickel particles thereto, the same procedure as in Example 3 was carried out (thus a magnetic field was applied) to obtain a film.

A cross-section of the resulting film was observed with SEM. One typical SEM image is shown in FIG. 8. As is understood from FIG. 8, it was confirmed that the film had a layered structure, and a plurality of layers were aligned substantially parallel to a surface (principal plane) of the film.

The aligned film according to the present invention can be widely used in various applications, and may be used as, for example, an electromagnetic shielding, and as an electrode of a capacitor or a battery.

REFERENCE SIGNS LIST 1a, 1b, 1c $M_{n+1}X_n$ layer
3a, 5a, 3b, 5b, 3c, 5c modifier or terminal T 7, 7a, 7b, 7c MXene layer
10 MXene (layered material)
11 magnetic nanoparticles
13 gap
15 first face
17 second face
20 aligned film

The invention claimed is:

1. An aligned film having first and second faces opposed to each other, the aligned film comprising:
   (a) a base material having a surface;
   (b) a layered material on the surface of the base material, the layered material comprising a plurality of layers aligned non-parallel to the first and second faces and between the first and second faces, and the plurality of layers of the layered material are in contact with the surface of the base material on at least one edge portion of the plurality of layers, each layer having a crystal lattice represented by:

$M_{n+1}X_n$ wherein M is at least one metal of Group 3, 4, 5, 6, or 7,
   X is a carbon atom, a nitrogen atom, or a combination thereof,
   n is 1, 2, or 3,
   each X is positioned within an octahedral array of M, and
   at least one of two opposing surfaces of said each layer has at least one modifier or terminal selected from a hydroxy group, a fluorine atom, an oxygen atom, and a hydrogen atom; and
   (c) magnetic nanoparticles carried on a layer surface and/or between two adjacent layers of the plurality of layers,
   wherein the plurality of layers aligned non-parallel to the first and second faces and between the first and second faces have a uniform alignment.

2. The aligned film according to claim 1, wherein the plurality of layers are aligned perpendicularly or at an angle of not more than 80 degrees with respect to at least one of the first and second faces.

3. The aligned film according to claim 1, wherein the nanoparticles are carried on the layer surface of the plurality of layers via the modifier or terminal.

4. The aligned film according to claim 1, wherein the nanoparticles are composed of any one or a combination of two or more selected from nickel, iron, cobalt and ferrite.

5. The aligned film according to claim 1, further comprising carbon nanotubes.

6. The aligned film according to claim 1, further comprising a hydrophilic organic binder in which the layered material and the nanoparticles are embedded.

7. The aligned film according to claim 1, wherein the aligned film is constructed and dimensioned for use as an electromagnetic shielding.

8. The aligned film according to claim 7, wherein the plurality of layers are inclined at an angle of more than 0 degree and not more than 80 degrees with respect to a direction perpendicular to the first face.

9. The aligned film according to claim 1, wherein the aligned film is constructed and dimensioned for use as an electrode of a capacitor or a battery.

10. The aligned film according to claim 9, wherein the plurality of layers are aligned perpendicularly to the first face, or inclined at an angle of more than 0 degree and not more than 80 degrees with respect to a direction perpendicular to the first face.

11. An aligned film having first and second faces opposed to each other, the aligned film comprising:
    (a) a base material having a surface;
    (b) a layered material on the surface of the base material, the layered material comprising a plurality of layers aligned non-parallel to the first and second faces and between the first and second faces, and the plurality of layers of the layered material are in contact with the surface of the base material on at least one edge portion of the plurality of layers, each layer having a crystal lattice represented by:

$M_{n+1}X_n$ wherein M is at least one metal of Group 3, 4, 5, 6, or 7,
    X is a carbon atom, a nitrogen atom, or a combination thereof,
    n is 1, 2, or 3,
    each X is positioned within an octahedral array of M, and
    at least one of two opposing surfaces of said each layer has at least one modifier or terminal selected from a hydroxy group, a fluorine atom, an oxygen atom, and a hydrogen atom; and
    (b) magnetic nanoparticles carried on a layer surface and/or between two adjacent layers of the plurality of layers,
    wherein the plurality of layers are aligned at an angle of not more than 80 degrees with respect to a perpendicular direction between at least one of the first and second faces.

12. The aligned film according to claim 11, wherein the nanoparticles are carried on the layer surface of the plurality of layers via the modifier or terminal.

13. The aligned film according to claim 11, wherein the nanoparticles are composed of any one or a combination of two or more selected from nickel, iron, cobalt and ferrite.

14. The aligned film according to claim 11, further comprising carbon nanotubes.

15. The aligned film according to claim 11, further comprising a hydrophilic organic binder in which the layered material and the nanoparticles are embedded.

16. The aligned film according to claim 11, wherein the aligned film is constructed and dimensioned for use as an electromagnetic shielding.

17. The aligned film according to claim 16, wherein the plurality of layers are inclined at an angle of more than 0 degree and not more than 80 degrees with respect to a direction perpendicular to the first face.

18. The aligned film according to claim 11, wherein the aligned film is constructed and dimensioned for use as an electrode of a capacitor or a battery.

19. The aligned film according to claim 18, wherein the plurality of layers are aligned perpendicularly to the first face, or inclined at an angle of more than 0 degree and not more than 80 degrees with respect to a direction perpendicular to the first face.

* * * * *